United States Patent
Nishikawa et al.

(10) Patent No.: US 7,329,897 B2
(45) Date of Patent: Feb. 12, 2008

(54) ORGANIC THIN FILM TRANSISTOR AND METHOD OF MANUFACTURING THE SAME

(75) Inventors: Takao Nishikawa, Shiojiri (JP); Tatsuya Shimoda, Fujimi-machi (JP); Yoshihiro Iwasa, Sendai (JP); Taishi Takenobu, Sendai (JP); Shinichiro Kobayashi, Sendai (JP); Tadaoki Mitani, Ishikawa-ken (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/882,091

(22) Filed: Jun. 30, 2004

(65) Prior Publication Data
US 2005/0032268 A1 Feb. 10, 2005

(30) Foreign Application Priority Data
Jul. 7, 2003 (JP) ............... 2003-193110

(51) Int. Cl.
*H01L 35/24* (2006.01)
*H01L 29/04* (2006.01)

(52) U.S. Cl. ............... 257/40; 257/57; 438/82; 438/99; 438/149; 438/151; 438/158; 438/161; 438/197

(58) Field of Classification Search ............. 257/40, 257/E39.002, E21.261, E51.005, 57; 438/149, 438/151, 158, 161, 197
See application file for complete search history.

(56) References Cited

U.S. PATENT DOCUMENTS

| | | | |
|---|---|---|---|
| 6,054,190 A * | 4/2000 | Ogawa et al. | ............... 427/510 |
| 6,335,539 B1 * | 1/2002 | Dimitrakopoulos et al. | .. 257/40 |
| 6,403,397 B1 | 6/2002 | Katz | |
| 6,433,359 B1 | 8/2002 | Kelley et al. | |
| 6,696,370 B2 * | 2/2004 | Jackson | ............... 438/780 |
| 6,949,762 B2 * | 9/2005 | Ong et al. | ............... 257/40 |
| 2003/0102471 A1 | 6/2003 | Kelley et al. | |
| 2003/0227153 A1* | 12/2003 | Yoo | ............... 280/221 |
| 2004/0222412 A1* | 11/2004 | Bai et al. | ............... 257/40 |

FOREIGN PATENT DOCUMENTS

EP 1041652 4/2000

(Continued)

OTHER PUBLICATIONS

"Thin-film transistors based on well-ordered thermally evaporated naphthacene films" Applied Physics Letters vol. 80, No. 16, pp. 2925-2927 (Apr. 22, 2002), D.J. Gundlach, et al.

(Continued)

*Primary Examiner*—Kenneth Parker
*Assistant Examiner*—Joseph Nguyen
(74) *Attorney, Agent, or Firm*—Harness, Dickey & Pierce, P.L.C.

(57) ABSTRACT

An organic thin film transistor and a method of manufacturing the same are provided. The transistor has a threshold voltage that can be easily controlled without changing the material forming an organic semiconductor film. The organic thin film transistor includes a gate electrode, a gate insulating film, a source electrode, a drain electrode, and an organic semiconductor film. A threshold voltage controlling film is provided between the gate insulating film and the organic semiconductor film.

15 Claims, 4 Drawing Sheets

FOREIGN PATENT DOCUMENTS

| | | |
|---|---|---|
| EP | 1596428 | 11/2005 |
| KR | 2002-0084427 | 11/2002 |
| WO | 03/010778 | 2/2003 |
| WO | 2004/075279 | 2/2004 |

OTHER PUBLICATIONS

Communication from European Patent Office regarding corresponding application, Feb. 2006.

Communication from Korean Patent Office re: related application, Jan. 24, 2006.

* cited by examiner

ORGANIC THIN FILM TRANSISTOR AND METHOD OF MANUFACTURING THE SAME

RELATED APPLICATIONS

This application claims priority to Japanese Patent Application No. 2003-193110 filed Jul. 7, 2003 which is hereby expressly incorporated by reference herein in its entirety.

BACKGROUND

1. Field of the Invention

The present invention relates to an organic thin film transistor and in particular to a method of controlling the threshold voltage of an organic thin film transistor.

2. Related Art

Thin film transistors (TFTs) have been commercialized as switching elements in active matrix liquid crystal displays and the like, and are fabricated using amorphous or polycrystalline silicon as a semiconductor.

In recent years, much attention has been placed on organic semiconductor materials as the semiconductor material for TFTs. Organic semiconductors can be easily formed in a thin film using simple techniques such as spin coating and vacuum vapor deposition, and there is also the advantage that the manufacturing process can be carried out at a lower temperature than for conventional TFTs in which amorphous or polycrystalline silicon is used. If the process temperature is reduced, it becomes possible to form a TFT on a plastic substrate that normally has low heat resistance, which has great potential for reducing the weight and cost of displays and also for greater variety in the applications of TFTs due to the flexibility of plastic substrates.

However, when TFTs have hitherto been developed using organic semiconductor materials, it has been difficult to control the threshold voltage by doping with impurities in the same way as when manufacturing a TFT that uses amorphous or polycrystalline silicon, and this has been an obstacle for commercialization.

Threshold voltages are described by an article by Jiyoul Lee et al (see APPLIED PHYSICS LETTERS, Vol. 80, 2925-2927 (2002), for example), but a technique for freely controlling threshold voltages is not described.

It is an object of the present invention to provide an organic thin film transistor whose threshold voltage can be easily controlled, without changing the material forming an organic semiconductor film, by providing a threshold voltage controlling film between the gate insulating film and the organic semiconductor film, and a method of manufacturing the same.

SUMMARY

An organic thin film transistor according to the present invention includes a gate electrode, a gate insulating film, a source electrode, a drain electrode, and an organic semiconductor film, and a threshold voltage controlling film between the gate insulating film and the organic semiconductor film.

According to the present invention, the threshold voltage controlling film is provided between the gate insulating film and the organic semiconductor film so that it is possible to easily change the threshold voltage without changing the material forming the organic semiconductor film.

The thickness of the threshold voltage controlling film may be equal to or less than 3 nm.

By forming the threshold voltage controlling film of a superthin film, when designing the construction of the transistor and during the manufacturing process, it is possible tb carry out handling in approximately the same state as when there is no threshold voltage controlling film, so that there are few, if any, restrictions due to the provision of the threshold voltage controlling film. Also, it is possible to form the threshold voltage controlling film with an extremely small amount of material, which is extremely economical.

The threshold voltage controlling film may be chemically absorbed by at least one of the gate insulating film and the organic semiconductor film. By carrying out chemisorption, it is possible to form a precise and strong film that is a superthin film and functions extremely effectively.

The threshold voltage controlling film may be formed from a silane compound. A silane compound is easily chemically absorbed by the surface of an oxide, such as $SiO_2$ and $Al_2O_3$ favorably used as the gate insulating film or a surface that has been made hydrophilic by a simple hydrophilic treatment, and so can favorably form a precise, strong superthin film (a monomolecular film). Here, the hydrophilic treatment is a process that forms a hydroxide group (—OH) on the surface.

The silane compound may include at least one trifluoromethyl group (—CF3). This is effective in shifting the threshold voltage towards the plus (positive) end of the axis.

The silane compound may include at least one amino group $NH_2$. This is effective in shifting the threshold voltage towards the minus (negative) end of the axis.

The organic semiconductor film may be formed from at least one substance selected from a group including organic low molecular weight materials such as pentacene and oligothiophene, organic high molecular weight materials such as polythiophene, metal complexes such as phthalocyanine, fullerene materials such as $C_{60}$, $C_{70}$, and metallofullerene, and carbon nanotubes.

A method of manufacturing an organic thin film transistor including a gate electrode, a gate insulating film, a source electrode, a drain electrode, and an organic semiconductor film according to the present invention comprises a step of forming a threshold voltage controlling film between the gate insulating film and the organic semiconductor film.

The thickness of the threshold voltage controlling film may be equal to or less than 3 nm.

The threshold voltage controlling film may be formed from a compound with a functional group capable of being chemically absorbed by at least one of the gate insulating film and the organic semiconductor film.

A compound forming the threshold voltage controlling film may be a silane compound.

The silane compound may include at least one trifluoromethyl group (—$CF_3$). This is effective in shifting the threshold voltage towards the plus (positive) end of the axis.

The silane compound may include at least one amino group $NH_2$. This is effective in shifting the threshold voltage towards the minus (negative) end of the axis.

The organic semiconductor film may be formed from at least one substance selected from a group including low organic molecular weight materials such as pentacene and oligothiophene, organic high molecular weight materials such as polythiophene, metal complexes such as phthalocyanine, fullerene materials such as $C_{60}$, $C_{70}$, and metallofullerene, and carbon nanotubes.

The method of manufacturing may include a step of carrying out a hydrophilic treatment on at least a base surface for the threshold voltage controlling film before the threshold voltage controlling film is formed.

DETAILED DESCRIPTION

Preferred embodiments of the present invention will now be described with reference to the drawings.

Organic Thin Film Transistor

Figure 1:
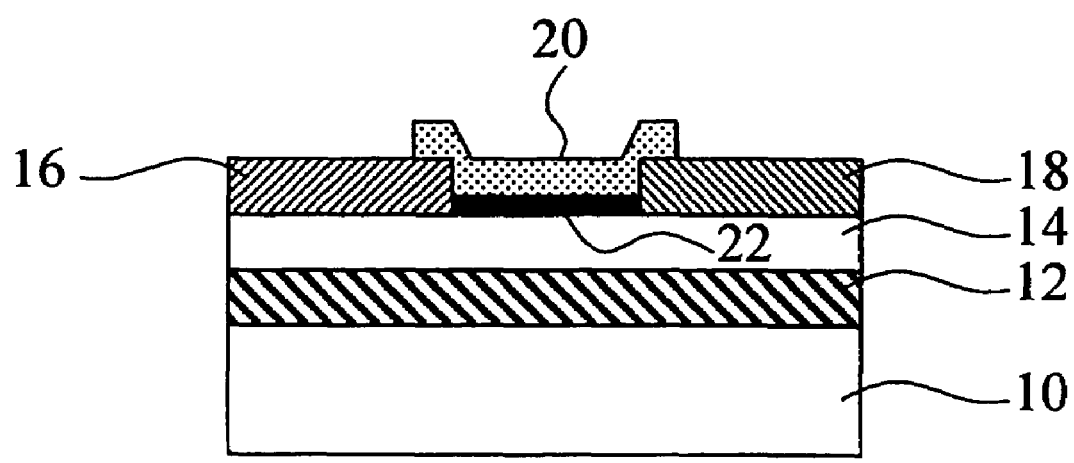
FIG. 1 is a cross-sectional view that schematically shows the construction of an organic thin film transistor according to an embodiment of the present invention.

The construction of an organic thin film transistor according to the present embodiment is described below FIG. 1 is a cross-sectional view schematically showing the construction of an organic thin film transistor according to an embodiment of the present invention.

The organic thin film transistor according to the present invention includes a gate electrode 12, a gate insulating film 14, a source electrode 16, a drain electrode 18, an organic semiconductor film 20, and a threshold voltage controlling film 22 that are provided on a substrate 10, with the threshold voltage controlling film 22 being provided between the gate insulating film 14 and the organic semiconductor film 20. Using this threshold voltage controlling film 22, it is possible to control the threshold voltage ($V_{th}$) of the organic thin film transistor without changing the material that composes the organic semiconductor film 20.

Manufacturing Process

The manufacturing process of the organic thin film transistor according to the present embodiment is described below.

FIGS. 2A to 2D are cross-sectional views schematically showing a method of manufacturing the organic thin film transistor according to an embodiment of the present invention.

There are no particular limitations on the substrate 10, and it is possible to use a P-type or N-type single crystal silicon substrate to which boron (B), phosphorous (P), antimony (Sb), or the like has been added as a dopant, a glass substrate, a quartz substrate, or a plastic substrate of polymethyl methacrylate, polyether sulfone, polycarbonate, or the like. In the present embodiment, a single crystal silicon substrate doped with an impurity is used as the substrate 10, with the doped part forming the gate electrode 12.

Figure 2A:
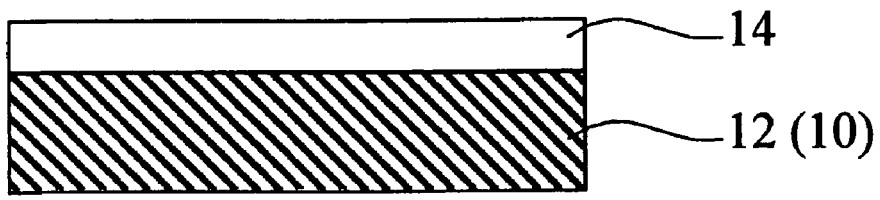
FIGS. 2A to 2D are cross-sectional views schematically showing the method of manufacturing an organic thin film transistor according to an embodiment of the present invention.

First, as shown in FIG. 2A, the gate insulating film 14 is formed on the substrate 10.

There are no particular limitations on the method of forming the gate insulating film 14, and the surface of the substrate may be oxidized by a thermal oxidization method to form silicon dioxide ($SiO_2$) or an insulating film of $SiO_2$, $Al_2O_3$, or the like may be formed by sputtering or a vacuum coating method, such as chemical vapor deposition (CVD).

The thickness of the gate insulating film 14 is 100 to 800 nm, for example.

Figure 2B:
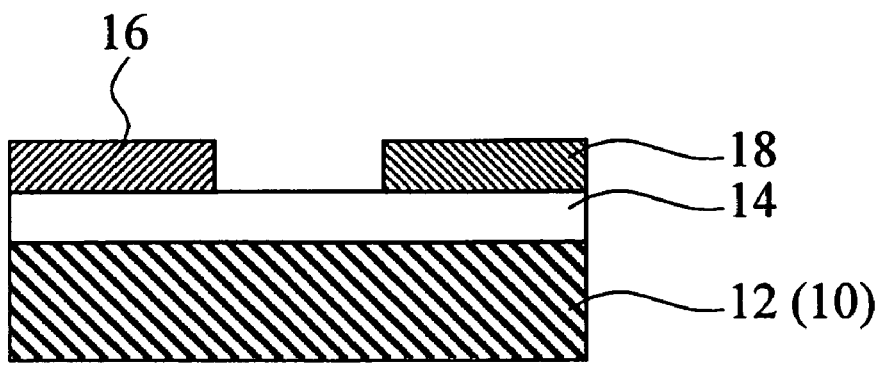

Next, as shown in FIG. 2B, the source electrode 16 and the drain electrode 18 are formed.

There are no particular limitations on the materials of the source electrode 16 and the drain electrode 18, which can be formed using metal electrodes, metal oxide electrodes, and carbon electrodes. For example, when fullerene ($C_{60}$) is used as the organic semiconductor film 20, platinum (Pt), gold (Au), silver (Ag), copper (Cu), aluminum (Al), indium-tin oxide (ITO) and the like can be favorably used.

The thickness of the source electrode 16 and the drain electrode 18 is in a range of 50 to 300 nm, for example.

The source electrode 16 and the drain electrode 18 are formed by the following method. A conductive thin film is formed on the gate insulating film 14 by a vacuum coating method and then a lithographic technique is used to form a predetermined pattern of the source electrode 16 and the drain electrode 18.

Figure 2C:
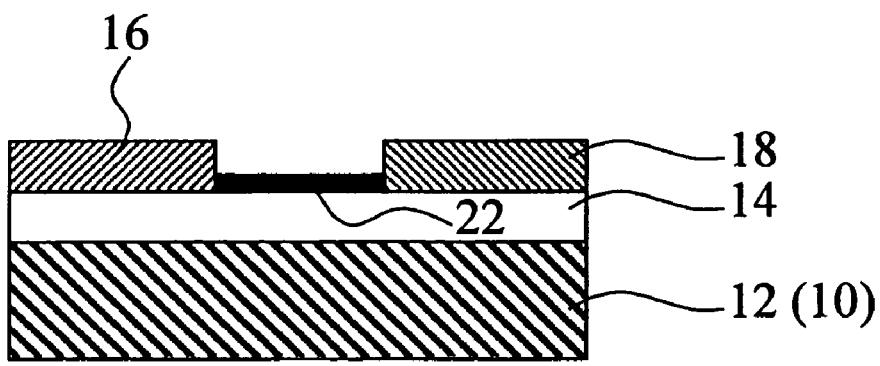

Next, as shown in FIG. 2C, the threshold voltage controlling film 22 is formed.

The threshold voltage controlling film 22 controls the threshold voltage characteristics of the organic semiconductor film 20 so as to become a desired value, and a silane compound expressed by the general formula $R^1(CH_2)_m SiR^2{}_n X_{3-n}$ (where m is a natural number and n is 1 or 2) can be used, for example. For a silane compound expressed by this general formula, in the case where "X" is a halogen, an alkoxy group, or the like, the compound can be easily applied to an oxide surface of $SiO_2$, $Al_2O_3$, or the like that is favorably used as the gate insulating film 14 by chemisorption to form a precise and strong superthin film (monomolecular film), with the end group $R^1$ being disposed on the surface of the threshold voltage controlling film 22. The threshold voltage controlling film 22 acts so as to control the threshold voltage of the organic thin film transistor. More specifically, by changing $R^1$, it is possible to control the threshold voltage characteristics of the organic semiconductor film 20. As examples, hydrogen (—H), methyl group (—$CH_3$), trifluoromethyl group (—$CF_3$), amino group (—$NH_2$), mercapto group (—SH), and the like can be used as $R^1$.

There are no particular limitations on the method of manufacturing the threshold voltage controlling film 22, and as examples the threshold voltage controlling film 22 may be formed using a vapor phase method such as CVD or a method, such as spin coating or dipping, that uses a liquid phase.

Before the threshold voltage controlling film 22 is formed, at least the surface that forms the base (here, the gate insulating film 14) for the threshold voltage controlling film 22 may be subjected to a hydrophilic treatment to facilitate chemisorption of the material forming the threshold voltage controlling film 22 by the base surface. Such hydrophilic treatment can use vacuum UV light with a wavelength of 5 to 200 nm or oxygen ($O_2$) plasma.

After the threshold voltage controlling film 22 is formed, rinsing with an alcohol such as ethanol or 2-propanol, or ultrapure water or the like may be carried out as necessary to remove adhering matter that is not required.

So long as the desired transistor characteristics are obtained, the threshold voltage controlling film 22 may be formed only in a partial region between the gate insulating film 14 and the organic semiconductor film 20 and does not need to be formed across the entire region. Also, so long as the obtained transistor characteristics are not problematic, the threshold voltage controlling film 22 may be formed at places aside from the region between the gate insulating film 14 and the organic semiconductor film 20, such as on the source electrode 16 and on the drain electrode 18.

Figure 2D:
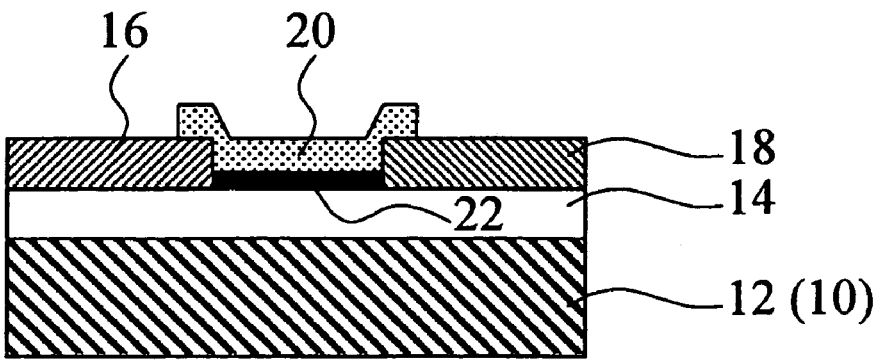

Next, as shown in FIG. 2D, the organic semiconductor film 20 is formed on the substrate.

At least one material selected from a group including organic low molecular weight materials such as pentacene and oligothiophene, organic high molecular weight materials such as polythiophene, metal complexes such as phthalocyanine, fullerene materials such as $C_{60}$, $C_{70}$, and metallofullerene, and carbon nanotubes can be used as the organic semiconductor film 20.

Vapor deposition, spin coating, casting, and the like can be used as the method of forming the organic semiconductor film 20.

As examples, a method such as lithography, coating with a mask, an ink jet method can be used to pattern the organic semiconductor film 18.

First Experiment

Test specimens (organic thin film transistors) were constructed as follows. An N-type single crystal substrate was used as the substrate and this was set as the gate electrode. A 300 nm thermal oxide film was formed on this substrate and the source electrode and drain electrode were formed on this using gold (Au). The thickness of the gold was 100 nm. The following three types of silane compound (a), (b), and (c) were respectively used to form different threshold voltage controlling films.

(a) $CF_3(CH_2)_9Si(OC_2H_5)_3$
(b) $CH_3(CH_2)_7Si(OC_2H_5)_3$
(c) $NH_2(CH_2)_3Si(OC_2H_5)_3$

The threshold voltage controlling films were formed with silane compounds (a) and (b) by CVD and with silane compound (c) by dipping.

The organic semiconductor film was then formed by coating the threshold voltage controlling film with fullerene (C60) by molecular beam epitaxy (MBE). The degree of vacuum during formation of this film was $1 \times 10^{-9}$ torr). The vapor deposition speed was 0.15 Å/s and the substrate temperature was 110° C.

Figure 3:
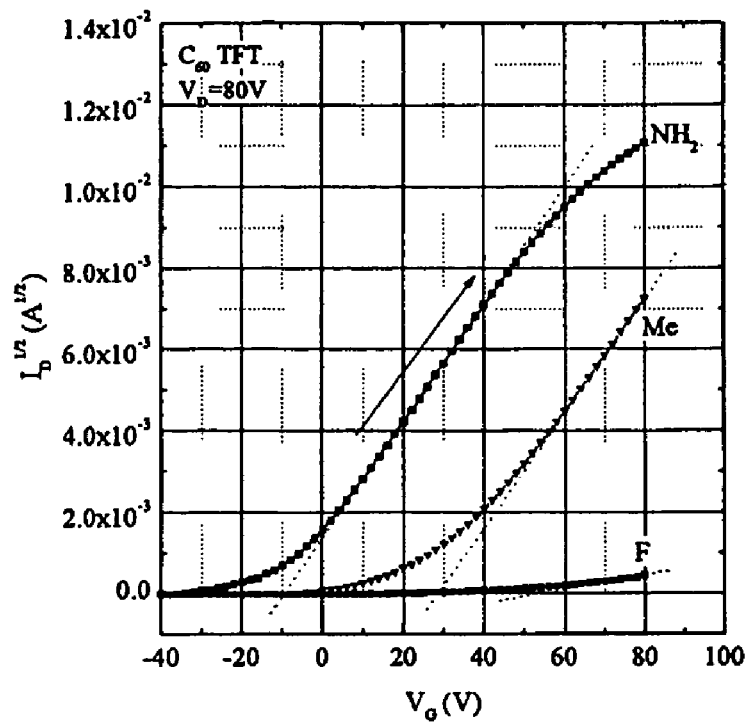
FIG. 3 is a graph showing the relationship between the drain current $I_D$ and the gate voltage $V_G$ of test specimens according to an embodiment of the present invention.

FIG. 3 is a graph showing the relationship between the drain current $I_D$ and the gate voltage $V_G$ for the case where the drain voltage $V_D$ of the three test specimens was set at 80V. In FIG. 3, the vertical axis shows the square root of the drain current $I_D$. As shown in FIG. 3, it can be seen that the characteristics shift leftwards as the silane compound changes in the order (a), (b), (c) (shown in FIG. 3 as "F", "Me", and "$NH_2$", respectively). For each compound, the intersection between the dotted line extrapolated on a left side of the linear part and the horizontal axis is the threshold voltage ($V_{th}$), and it was observed that the value of $V_{th}$ decreases in the order (a), (b), (c). This shows that it is possible to control the $V_{th}$ of a thin film transistor ($C_{60}$-TFT) fabricated using $C_{60}$ with the threshold voltage controlling film.

Second Experiment

Test specimens (organic thin film transistors) were constructed as follows. An N-type single crystal substrate was used as the substrate and this was set as the gate electrode. A 300 nm thermal oxide film was formed on this substrate and the source electrode and drain electrode were formed on this using gold (Au). The thickness of the gold was 100 nm. The following three types of silane compound (a), (b), and (c) were respectively used to form different threshold voltage controlling films.

(a) $CF_3(CH_2)_9Si(OC_2H_5)_3$
(b) $CH_3(CH_2)_7Si(OC_2H_5)_3$
(c) $NH_2(CH_2)_3Si(OC_2H_5)_3$

The threshold voltage controlling films were formed with silane compounds (a) and (b) by CVD and with silane compound (c) by dipping.

The organic semiconductor film was then formed by coating the threshold voltage controlling film with pentacene ($C_{22}H_{14}$) by molecular beam epitaxy (MBE). The degree of vacuum during formation of this film was $1 \times 10^{-9}$ torr). The vapor deposition speed was 0.15 Å/s and the substrate temperature was 30° C.

Figure 4:
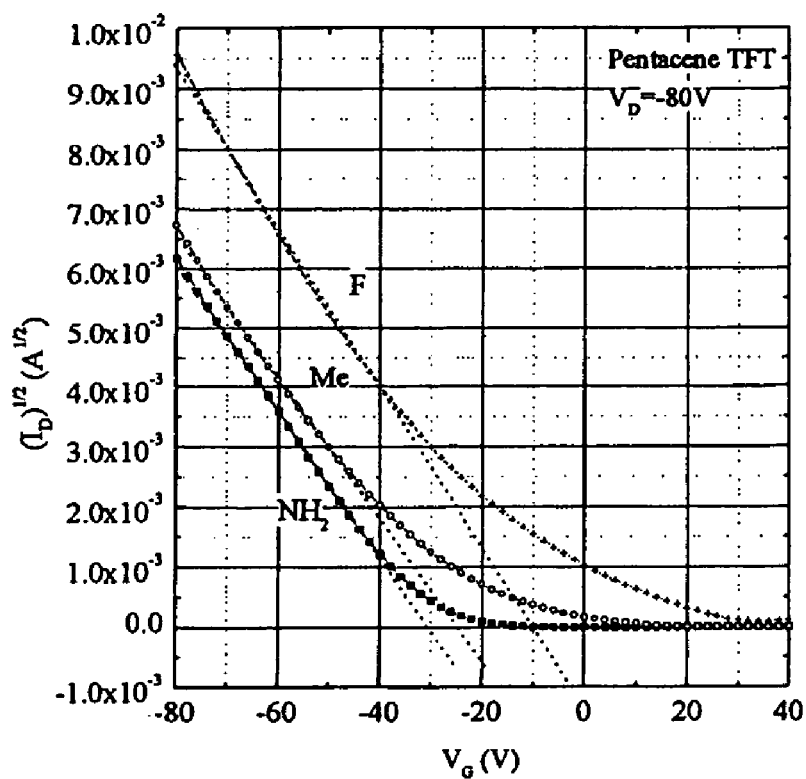
FIG. 4 is a graph showing the relationship between the drain current $I_D$ and the gate voltage $V_G$ of test specimens according to an embodiment of the present invention.

FIG. 4 is a graph showing the relationship between the drain current $I_D$ and the gate voltage $V_G$ for the case where the drain voltage $V_D$ of the three test specimens was set at 80V. In FIG. 4, the vertical axis shows the square root of the drain current $I_D$. As shown in FIG. 4, it can be seen that the characteristics shift leftwards as the silane compound changes in the order (a), (b), (c) (shown in FIG. 4 as "F", "Me", and "$NH_2$", respectively). For each compound, the intersection between the dotted line extrapolated on a right side of the linear part and the horizontal axis is the threshold voltage ($V_{th}$), and it was observed that the value of $V_{th}$ increases in the order (a), (b), (c). This shows that it is possible to control the $V_{th}$ of a thin film transistor (pentacene-TFT) fabricated using pentacene according to the threshold voltage controlling film.

Modifications

The above embodiments can be modified as follows.

Figure 5:
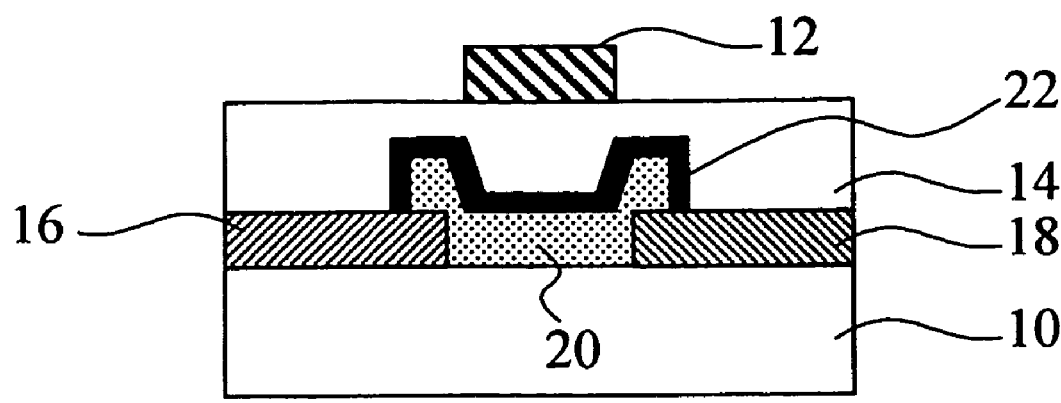
FIG. 5 is a cross-sectional view that schematically shows a modified construction of an organic thin film transistor according to an embodiment of the present invention.

As shown in FIG. 5, the drain electrode 18 may be provided on an organic semiconductor film layer via a gate insulating film. In this case, compared to the construction shown in FIG. 1, there is the advantage of a larger degree of freedom for the substrate.

Figure 6:
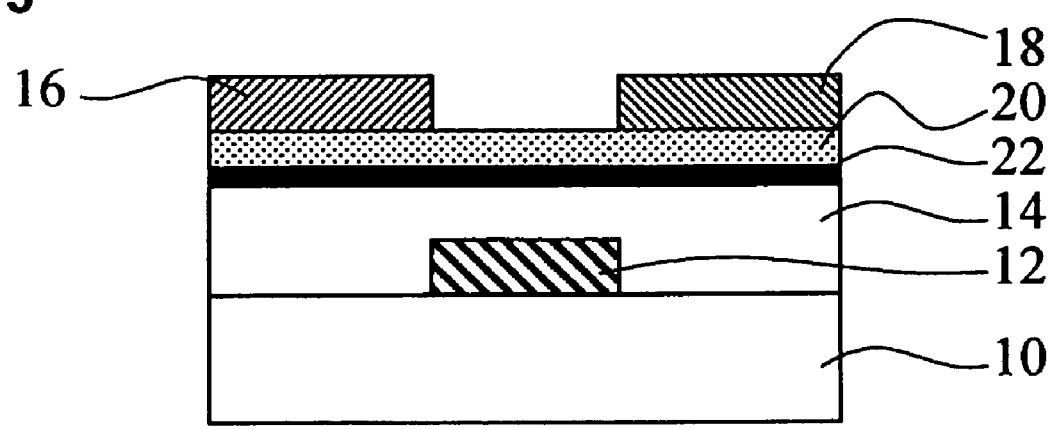
FIG. 6 is a cross-sectional view that schematically shows a modified construction of an organic thin film transistor according to an embodiment of the present invention.

Also, as shown in FIG. 6, the source electrode 16 and the drain electrode 18 may be formed on the organic semiconductor film 20. In this case, compared to the construction shown in FIG. 1, there is the advantage that there is greater mobility since it is harder for the drain electrode 18 and the source electrode 16 to be affected by the material of the organic semiconductor film 20.

The present invention is not limited to the embodiments described above and can be modified in a variety of ways without departing from the scope of the invention.

EFFECTS OF THE INVENTION

As described above, according to the present invention, by providing a threshold voltage controlling film between a gate insulating film and an organic semiconductor film, it is possible to easily control the threshold voltage without changing the material used to form the organic semiconductor film.

What is claimed is:

1. An organic thin film transistor comprising:
   a gate electrode;
   a gate insulating film that is formed on the gate electrode;
   a source electrode that is formed on the gate insulating film and that contacts the gate insulating film;
   a drain electrode that is formed on the gate insulating film and that contacts the gate insulating film, wherein each of the source and drain electrodes includes inner and outer ends;
   a threshold voltage controlling film that is formed on the gate insulating film, that contacts the gate insulating film, and that is located entirely between the inner ends of the source electrode and the drain electrode; and
   an organic semiconductor film that is formed on the threshold voltage controlling film and that is located between the source electrode and the drain electrode.

2. The organic thin film transistor according to claim 1 wherein a thickness of the threshold voltage controlling film is less than or equal to 3 nm.

3. The organic thin film transistor according to claim 1 wherein the threshold voltage controlling film is chemically absorbed by at least one of the gate insulating film and the organic semiconductor film.

4. The organic thin film transistor according to claim 1 wherein the threshold voltage controlling film is formed from a silane compound.

5. The organic thin film transistor according to claim 4 wherein the silane compound includes at least one of a trifluoromethyl group and an amino group.

6. The organic thin film transistor according to claim 5 wherein the at least one of the trifluoromethyl group and the amino group is selectively added to the silane compound to one of increase and decrease a threshold voltage of the organic thin film transistor.

7. The organic thin film transistor according to claim 1 wherein the organic semiconductor film is formed from at least one substance selected from organic low molecular weight materials, organic high molecular weight materials, metal complexes, fullerene materials, and carbon nanotubes.

8. A method of manufacturing an organic thin film transistor comprising:
forming a gate electrode;
forming a gate insulating film on the gate electrode;
forming a source electrode on the gate insulating film and in contact with the gate insulating film;
forming a drain electrode on the gate insulating film and in contact with the gate insulating film, wherein each of the source and drain electrodes includes inner and outer ends;
forming a threshold voltage controlling film on the gate insulating film, in contact with the gate insulating film, and located entirely between the inner ends of the source electrode and the drain electrode; and
forming an organic semiconductor film on the threshold voltage controlling film and located between the source electrode and the drain electrode.

9. The method of claim 8 wherein a thickness of the threshold voltage controlling film is less than or equal to 3 nm.

10. The method of claim 8 wherein the threshold voltage controlling film is formed from a compound with a functional group capable of being chemically absorbed by at least one of the gate insulating film and the organic semiconductor film.

11. The method of claim 8 wherein the threshold voltage controlling film is formed from a silane compound.

12. The method of claim 11, wherein the silane compound includes at least one of a trifluoromethyl group and an amino group.

13. The method of claim 12 wherein the at least one of the trifluoromethyl group and the amino group is selectively added to the silane compound to one of increase and decrease a threshold voltage of the organic thin film transistor.

14. The method of claim 8 wherein the organic semiconductor film is formed from at least one substance selected from organic low molecular weight materials, organic high molecular weight materials, metal complexes, fullerene materials, and carbon nanotubes.

15. The method of claim 8 further comprising a step of carrying out a hydrophilic treatment on at least a base surface for the threshold voltage controlling film before the threshold voltage controlling film is formed.

* * * * *